United States Patent
Wheat et al.

(10) Patent No.: US 6,253,441 B1
(45) Date of Patent: Jul. 3, 2001

(54) FABRICATION OF ARTICLES HAVING A COATING DEPOSITED THROUGH A MASK

(75) Inventors: Gary E. Wheat, Madisonville; Terri K. Brown, Central City, both of KY (US)

(73) Assignee: General Electric Company, Cincinnati, OH (US)

(*) Notice: Subject to any disclaimer, the term of this patent is extended or adjusted under 35 U.S.C. 154(b) by 0 days.

(21) Appl. No.: 09/293,204

(22) Filed: Apr. 16, 1999

(51) Int. Cl.[7] ................. B21B 1/46; B05D 1/02; B05C 11/11
(52) U.S. Cl. .............. 29/527.2; 29/424; 427/421; 427/427; 118/504
(58) Field of Search .................. 427/282, 259, 427/421, 427; 29/423, 527.2, 424; 118/504

(56) References Cited

U.S. PATENT DOCUMENTS

| | | | |
|---|---|---|---|
| 3,302,612 | * 2/1967 | Stutzman | 118/504 |
| 3,667,988 | * 6/1972 | Horiki | 427/423 |
| 3,678,892 | * 7/1972 | Fairchild | 118/504 |
| 3,866,565 | * 2/1975 | Ridout | 118/504 |
| 3,904,789 | * 9/1975 | Speirs et al. | 427/423 |
| 3,930,069 | * 12/1975 | Stephens | 427/423 |
| 4,033,803 | * 7/1977 | Coder | 427/423 |
| 4,049,857 | * 9/1977 | Hammer | 118/504 |
| 4,313,970 | * 2/1982 | Jones et al. | 427/423 |
| 4,385,645 | * 5/1983 | Campbell et al. | 427/282 |
| 4,451,971 | * 6/1984 | Milgram | 427/423 |
| 4,876,119 | * 10/1989 | Takeda et al. | 427/250 X |
| 4,978,558 | * 12/1990 | Lamm | 427/423 |
| 5,049,445 | * 9/1991 | Arvidsson et al. | 427/423 |
| 5,225,246 | * 7/1993 | Beers et al. | 427/423 |
| 5,747,117 | * 5/1998 | Dannenberg | 427/423 |
| 5,786,028 | * 7/1998 | Cantwell | 427/423 |
| 5,807,610 | * 9/1998 | Cox et al. | 427/423 |
| 5,813,118 | * 9/1998 | Roedl et al. | 29/889.1 |
| 5,817,399 | * 10/1998 | Kalman | 427/423 |
| 5,885,395 | * 3/1999 | Western | 427/282 |
| 5,902,642 | * 5/1999 | Horiki et al. | 427/423 |
| 5,915,743 | * 6/1999 | Palma | 29/402.18 |
| 5,980,678 | * 11/1999 | Tselesin | 427/427 |
| 5,980,984 | * 11/1999 | Modera et al. | 427/421 |
| 6,025,145 | * 2/2000 | Langeman | 427/423 |

OTHER PUBLICATIONS

Nissim Shaltiel et al., "Chromalloy Israel's New T–Block Materials", pp. 1–4, Nov. 1, 1995.

* cited by examiner

*Primary Examiner*—S. Thomas Hughes
*Assistant Examiner*—Marc Jimenez
(74) *Attorney, Agent, or Firm*—Andrew C. Hess; David L. Narciso

(57) ABSTRACT

A substrate article is processed by masking a first portion of the substrate article with a maskant including a foil layer overlying and contacting the first portion of the substrate article, leaving a second portion of the substrate article exposed, and a mask layer overlying and contacting the foil layer. The mask layer may be formed of a mixture of aluminum oxide and metal powders or carbon. The masked substrate article is processed to deposit a coating, such as an aluminum coating, on the second portion of the substrate article, without removing the maskant. The substrate article may instead be masked by carbon without the underlying nickel layer. After coating, the substrate article may be further processed by brazing to the first portion of the substrate article.

23 Claims, 2 Drawing Sheets

FABRICATION OF ARTICLES HAVING A COATING DEPOSITED THROUGH A MASK

FIELD OF THE INVENTION

This invention relates to the coating of a surface of a metallic article, and, more particularly, to such coating conducted with a patterned mask that permits coating in some areas and prevents coating in other areas of the surface.

BACKGROUND OF THE INVENTION

Nickel-base superalloy components of gas turbines are sometimes coated with aluminum and then heated to diffuse the aluminum into the surface of the article. The aluminum-rich surface is oxidized to produce an adherent aluminum oxide scale on the surface of the article. The aluminum oxide scale is an effective barrier against further oxidation and corrosion of the component in service.

The aluminum coating is typically applied by a vapor phase deposition process. In one such approach, aluminum fluoride gas is contacted to the component surface under conditions such that the compound decomposes to leave a layer of aluminum deposited on the surface. The aluminum diffuses into the surface during the deposition and any post-deposition heat treatment, producing the aluminum-enriched surface region.

It is sometimes the case in such deposition processes that a first portion of the surface of the article is to be left uncoated, and a second portion of the surface of the article is to be coated with aluminum. The uncoated portion may be required for any of several reasons, such as allowing attachment of other structure to the article by brazing. Any brazed joint between the aluminum coating and another structure is ordinarily brittle, so that the brazed joint must be made to the uncoated first portion.

In order to prevent deposition of aluminum from the aluminum-containing gas, the first (uncoated) portion of the surface of the article is physically covered with a mask. The mask prevents contact of the aluminum-containing gas to the first portion. Available maskants usually include sources of $Ni^{+2}$ and $Cr^{+3}$ ions in a binder complex with $Al_2O_3$ particles. These maskants are intended to prevent the coating vapors from reaching the surface of the article, and to prevent depletion of the alloy components from the surface of the first portion of the surface.

The present inventors have observed that, after removal of the maskant from the first portion of the substrate surface, in some cases there are surface oxides on the first portion of the surface that impede subsequent brazing operations. It is believed that these surface oxides result from the chemical interaction of the maskant with the masked surface. The surface oxides cannot be readily removed in many cases, because their removal may cause damage to the aluminide coating. In addition, there may be surface depletion of elements from the substrate due to diffusional processes, altering the chemistry of the surface region of the substrate in an adverse manner.

These same types of problems arise in relation to other coatings as well, where masks are used. There is a need for an improved approach to the coating of a portion of an article surface with a coating such as an aluminide, where some of the surface must remain uncoated.

BRIEF SUMMARY OF THE INVENTION

The present invention provides techniques for masking of the surfaces of articles which are to be coated. In one approach, a method for processing a substrate article comprises the steps of furnishing a substrate, and masking a first portion of the substrate article with a maskant. The maskant includes a foil layer overlying and contacting the first portion of the substrate, leaving a second portion of the substrate exposed, and a mask layer overlying and contacting the foil layer. The foil layer is made of a material selected appropriately for the composition of the substrate, such as nickel for a nickel-base substrate, cobalt for a cobalt-base substrate, or titanium for a titanium-base substrate. The mask layer may be for example a conventional masking layer or a carbon masking layer. The method further includes processing the substrate article to deposit a coating on the second portion of the substrate, without removing the maskant. The coating may be any operable coating material. The coating is preferably a metal such as aluminum, but may be other metals compounds, ceramics, or organic compounds.

In a variation of this approach, a method for processing a substrate article comprises the steps of furnishing a substrate, and masking a first portion of the substrate article with a maskant. The maskant includes a graphite mask layer, preferably a freestanding graphite template piece that may be reused, overlying the first portion of the substrate, leaving a second portion of the substrate exposed. The masked surface is processed to deposit a coating on the second portion of the substrate, without removing the maskant.

The present approach may be used with a foil layer between the substrate and the mask, so that after coating the first portion of the substrate is suitable for brazing without further processing. If the foil layer is omitted and the graphite template piece is used as the mask, the masking costs are reduced due to the reusability of the mask. Additionally, a passage may be provided through the mask template piece to allow access of the aluminiding gas to the interior of a hollow substrate article. Other features and advantages of the present invention will be apparent from the following more detailed description of the preferred embodiments, taken in conjunction with the accompanying drawings which illustrate, by way of example, the principles of the invention. The scope of the invention is not, however, limited to these preferred embodiments.

DETAILED DESCRIPTION OF THE INVENTION

Figure 1:
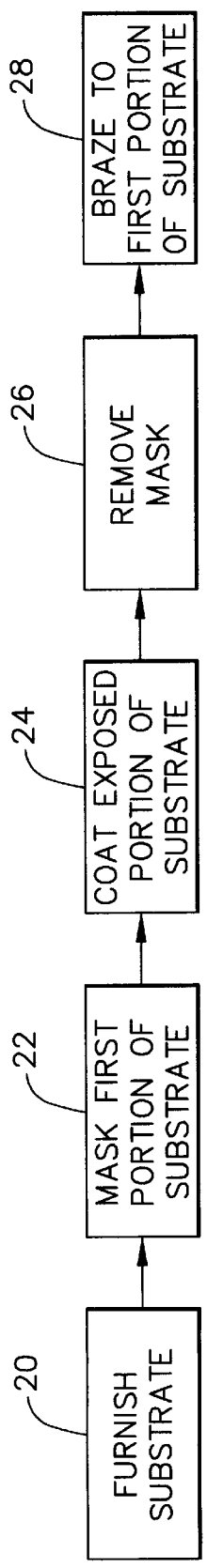
FIG. 1 is a process block diagram for a preferred approach for practicing the invention.
Figure 2:
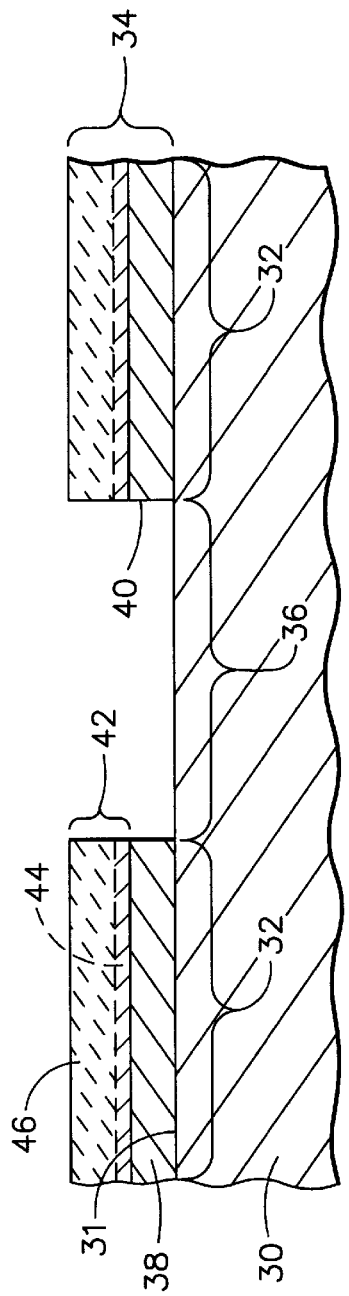
FIG. 2 is a sectional view of a masked substrate article according to a first embodiment of the invention.
Figure 3:
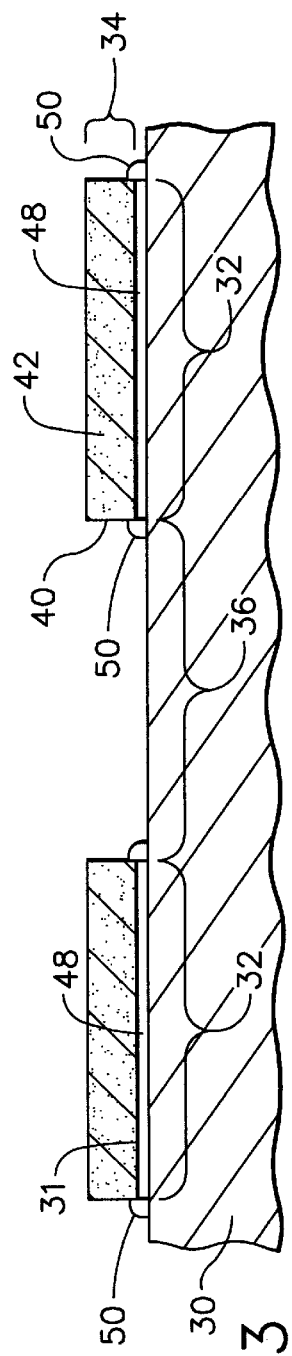
FIG. 3 is a sectional view of a masked substrate article according to a second embodiment of the invention.

FIG. 1 illustrates the preferred method of the invention, and FIGS. 2–3 depict two embodiments of the masked structure. A substrate article 30 having a substrate surface 31 is furnished, numeral 20. The substrate article 30 is preferably made of a nickel-base superalloy. "Nickel-base" as used herein means that the alloy contains more nickel by weight than any other element. An example of a nickel-base superalloy with which the present invention is operable is Rene 80, a known alloy having a nominal composition, in weight percent, of from about 13.7 to about 14.3 percent chromium, from about 4.8 to about 5.2 percent titanium, from about 2.8 to about 3.2 percent aluminum, from about 3.7 to about 4.3 percent tungsten, from about 3.7 to about 4.3 percent molybdenum, from about 9.0 to about 10.0 percent cobalt, from about 0.15 to about 0.19 percent carbon, from about 0.01 to about 0.02 percent boron, from about 0.02 to about 0.10 percent zirconium, balance nickel and minor elements totaling 100 percent. Other substrates such as cobalt-base or titanium-base alloys may be used as well.

The substrate article 30 may be of any operable shape, such as, for example, a gas turbine blade, a gas turbine vane, a gas turbine nozzle, a piece of tubing, a tool shape, a pump impeller, a pump rotor, a fan blade, an element of electronic hardware, and the like. The substrate article 30 may be prepared by any operable approach known in the art, such as casting or forging, with casting preferred. The substrate article 30 may be furnished in substantially its final shape and dimensions in step 20, inasmuch as the coating of the present approach is very thin and adds little to the dimensions of the article. The substrate article 30 may instead be furnished slightly undersized to account for the thickness of the applied coating.

A first portion 32 of the surface 31 of the substrate article 30 is masked with a maskant 34, numeral 22, leaving a second portion 36 of the surface 31 unmasked and exposed. A first embodiment of the maskant is illustrated in FIG. 2. The maskant 34 includes a foil layer 38 overlying and contacting the first portion 32 of the surface of the substrate 30. The foil layer 38 is preferably a solid material with no openings therethrough, but for some applications it could be a mesh or other perforated construction. The solid foil layer 38 inhibits the diffusional loss of the chemical components of the substrate, and is therefore preferred. Where such diffusional loss is not a concern, the perforated construction could be used.

The foil layer 38 is made of a material selected appropriately for the substrate. Preferably, the foil layer 38 would have a composition that corresponds to that of the substrate, in that the chemical element that is present in the highest concentration in the substrate article is also present in the highest concentration in the foil layer 38. For example, the material of the foil layer 38 would preferably be pure nickel or a nickel-base alloy for a nickel-base substrate, pure cobalt or a cobalt-base alloy for a cobalt-base substrate, or pure titanium or a titanium-base alloy for a titanium-base substrate. The foil layer 38 is preferably from about 0.003 to about 0.005 inch thick. An opening 40 through the foil layer 38 exposes the second portion 36.

During the subsequent deposition and optional diffusion of the coating material, the material of the foil layer 38 inhibits diffusional loss of the chemical components of the substrate, and also provides a source for the enrichment of the first portion 32 of the surface region of the substrate contacted by the foil layer 38. For example, in the case of the nickel-base superalloy substrate article 30 and the nickel foil layer 38, nickel diffuses into the surface of the first portion 32 of the superalloy substrate, inhibiting oxidation of that region. The reduction in oxidation of the first portion 32 of the substrate surface results in improved subsequent processing, such as improved brazeability of the first portion 32. For this reason, it is preferred that the foil layer 38 be pure metal or of low alloy content. That is, in the case of the nickel-base superalloy substrate article 30, the foil layer 38 is preferably pure nickel. An alloyed nickel foil layer 38 is operable, but less preferred.

In the embodiment of FIG. 2, the maskant 34 further includes a mask layer 42 overlying and contacting the foil layer 38. The mask layer 42 may be of any operable type. In one form, the mask layer 42 comprises a first mask sublayer 44 overlying and contacting the foil layer 38, and a second mask sublayer 46 overlying and contacting the first mask sublayer 44. The first mask sublayer 44 is formed of a mixture of nickel and chromium powders in a binder. The second mask sublayer 46 is formed of a mixture of aluminum oxide powder, other ceramic powders such as aluminum silicate, and metallic powders, such as nickel powder, in a binder. A suitable mask layer 42 with integrally formed first mask sublayer 44 and second mask sublayer 46 may be purchased as T-block masking tape from Chromalloy Israel, Ltd. The mask layer 42 may be of any operable thickness, and is typically from about 0.028 inch to about 0.090 inch thick.

In this maskant system, the mask layer 42 provides a barrier against the contacting of coating-containing vapors to the first portion 32 of the surface 31 of the substrate article 30. However, absent the foil layer 38, the constituents of the mask layer 42 may chemically react with the substrate alloy in the masked first portion 32, producing oxides and other chemical reaction products on the surface of the first portion 32. These oxides interfere with subsequent processing operations, and are therefore undesirable. The presence of the foil layer 38 prevents direct contact of the mask layer 42 to the first portion 32 of the surface 31 of the substrate article 30, preventing such chemical reaction and contamination. The result is a coated article with a masked first region 32 that is more suitable for subsequent processing such as brazing, than a comparably processed article in which the foil layer 38 is absent.

The mask layer 42 of the embodiment of FIG. 2 may instead be carbon, preferably in the form of graphite. In this case, there are no sublayers 44 and 46, only a monolithic carbon mask layer. The carbon mask layer may be of any operable form, such as a solid piece of graphite or graphite powders. If the carbon mask layer 42 is formed of carbon powders, the powders may be bound together with a volatile binder such as a mixture of methyl alcohol, methyl isobutyl xatane, and formaldehyde and furnished in tape or paste form for application to the surface 31. The carbon mask layer 42 is preferably from about 0.080 inch to about 1.0 inch thick. Alternatively, the carbon mask layer 42 may be a freestanding solid carbon piece machined or otherwise fabricated to conform to the first portion 32 of the surface 31. The opening 40 is machined through the solid carbon piece. In the embodiment of FIG. 2 using a carbon mask layer 42, the foil layer 38 performs the same function of separating the carbon mask layer 42 from the first portion 32 of the surface 31, to prevent formation of undesirable carbides in the substrate 30 at the first portion 32 of the surface 31.

Another embodiment of the maskant 34 is illustrated in FIG. 3. Elements common to the embodiment of FIG. 2 are assigned the same reference numerals, and the above discussion of these elements is incorporated here. This maskant 34 of FIG. 3 includes only a single mask layer 42 of carbon, preferably graphite, with no foil layer 38. This mask layer 42 may be of any operable form, such as carbon powders or a solid carbon piece, as discussed earlier. If it is a solid freestanding carbon piece, in many instances it may be difficult to machine the carbon piece to precisely conform to the shape and dimensions of the substrate 30, so that there is a sometimes a small gap 48 between the first portion 32 of the surface 31, and the inside surface of the carbon mask layer 42. A sealant 50 in the form of a slurry of fine aluminum oxide powder, or a mixture of aluminum oxide and titanium oxide powder, in an evaporable carrier slurry such as a mixture of methyl alcohol, methyl isobutyl xatane, and formaldehyde may be applied around all of the exposed edges of the maskant 34 to prevent the coating gas from penetrating into the gap 48.

In either of the embodiments of FIGS. 2 and 3, where the freestanding carbon or graphite mask layer 42 is used, significant economies may be realized. The freestanding mask layer 42 may be fabricated once, used, and then reused multiple times by simply removing it, typically by sliding, from a substrate article that has been coated, and installing it onto another substrate article that is to be coated. The freestanding carbon or graphite mask layer 42 thus serves as a reusable template for coating processing of substrate articles.

Figure 4:
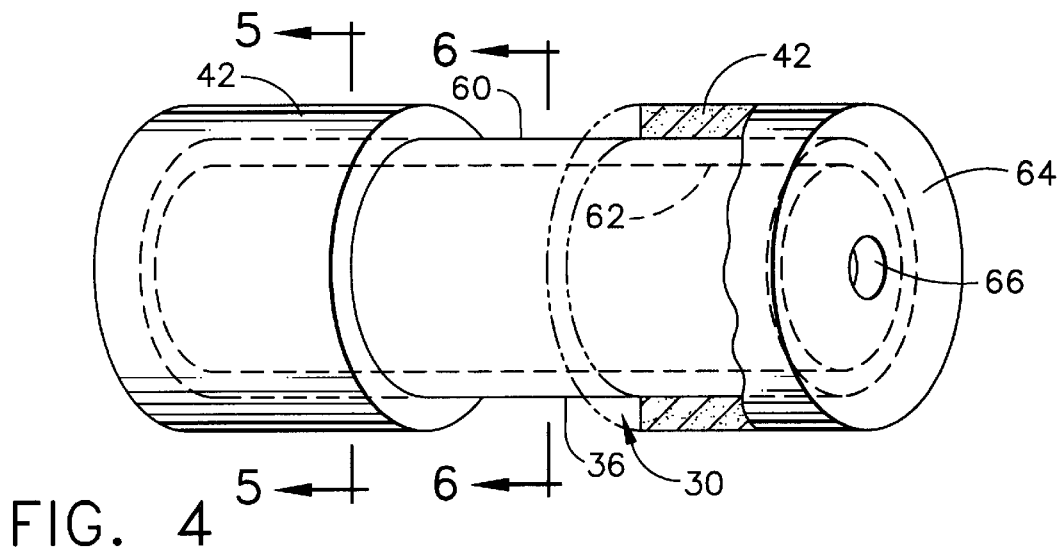
FIG. 4 is a perspective view of a masked article according to a third embodiment of the invention.
Figure 5:
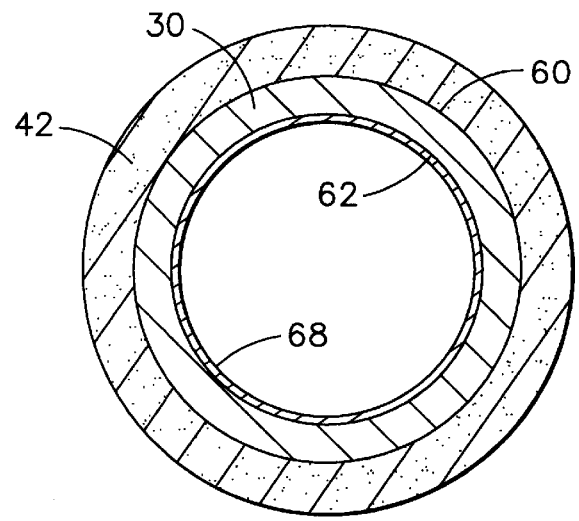
FIG. 5 is a sectional view of the masked article of FIG. 4, taken along line 5—5.
Figure 6:
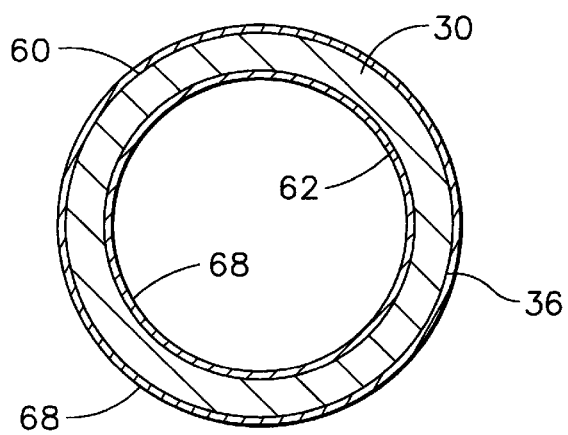
FIG. 6 is a sectional view of the masked article of FIG. 4, taken along line 6—6.

FIGS. 4–6 illustrate such an application of a reusable carbon or graphite mask layer 42 which serves as a reusable template. The substrate article 30 is hollow, such as a hollow cylinder. It is desired to coat portions of the exterior 60 of the substrate article 30, as well as the entire interior 62. The freestanding graphite mask layer 42 is machined to fit over the exterior 60, with openings 40 therethrough to define the areas which are to be coated. The mask layer 42 is sealed at its edges as previously described. An end piece 64 of the mask layer 42 is provided with an aperture 66. During subsequent coating, the vapor bearing the coating material contacts the second portion 36 of the exterior 60, as well as the interior 60 by flow through the aperture 66. FIGS. 5 and 6 illustrate the locations of a coating 68 on the exterior 60 and the interior 62 of the substrate article 30 achieved by this technique. The freestanding mask layer 42 may be removed and reused. This approach may be used either with or without the foil layer 38 of FIG. 2. If the masked region is to be later processed, as by brazing, the foil layer 38 is utilized. Returning to the process illustrated in FIG. 1, the substrate 30 is coated, numeral 24, to apply a coating to all unmasked, exposed regions defined as the second portion 36 of the surface 31 of the substrate 30. Any operable vapor coating process may be used, as appropriate and known in the art for the specific type of coating material that is to be deposited. Operable coating materials include organic coatings, and inorganic coatings such as ceramic compounds (e.g., silicon dioxide, titanium diboride) and metals (e.g., aluminum, tungsten, rhenium, molybdenum, hafnium). The preferred application of the present inventors is aluminum coating, and that preferred coating application will be described in greater detail. The aluminide processing to produce an aluminum coating is accomplished by any operable approach. In one preferred approach a hydrogen halide gas, such as hydrogen chloride or hydrogen fluoride, is contacted with aluminum metal or an aluminum alloy to form the corresponding aluminum halide gas. The aluminum halide gas is contacted to the masked substrate article 30, depositing an aluminum layer over the second (unmasked) portion 36 of the surface 31 of the substrate article 30. Although the processing may vary according to the nature of the desired aluminum deposition, the aluminiding treatment is typically accomplished at a temperature of 1925–2050° F. for 4–16 hours. The deposition is accomplished at elevated temperature so that aluminum atoms transferred to the surface diffuse into the second portion 36 of the substrate 30. The diffusion treatment may be continued after the deposition is discontinued, to diffuse the aluminum into the surface of the substrate. Examples of other operable aluminum deposition processes include co-deposition with the article in a powder pack, vapor phase aluminizing, and chemical vapor deposition. These aluminum-deposition processes are known in the art.

After coating and diffusion, where applicable, are complete, the coated substrate article 30 is cooled, and the maskant 34 is removed, numeral 26. If the maskant 34 is of the freestanding type, it may be removed and later reused. If the maskant 34 is solely layers and tapes, it is typically be removed and discarded. The masked first portions 32 of the substrate 30 may be post-processed as desired. In one typical post-processing, a braze attachment is made to a masked first portion 32 of the substrate article 30, numeral 28. The presence of the foil layer 38 in the earlier coating step 24 serves to prevent depletion of elements from the substrate, to enrich the base-metal content of the surface, to inhibit oxidation of the surface, and to prevent contamination of the first portion 32 during coating, so that the brazing may be more effectively accomplished directly to the first portion 32 after the maskant is removed. It is not necessary to remove contaminants such as oxides and carbides from the first portion 32 to permit the brazing, as is the case for prior approaches that do not include the foil layer 38. Such contaminants, where present, either prevent the wetting necessary for successful brazing, or serve to embrittle the brazed joint if a joint is formed. The removal of contaminants has been accomplished in prior processes using grit blasting, which is time consuming, expensive, not always successful, and may result in unintentional removal of some of the coated area and excessive removal of substrate material.

The present invention has been practiced to aluminide aircraft gas turbine engine nozzles. Inserts and covers were successfully brazed to the masked portions of the nozzle, after the maskant was removed. The braze joints met all strength and physical property requirements and standards.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for processing a substrate article, comprising the steps of:
   furnishing a substrate;
   masking a first portion of the substrate article with a maskant including
      a metallic foil layer overlying and contacting the first portion of the substrate, leaving a second portion of the substrate exposed, and
      a mask layer overlying and contacting the foil layer, the mask layer comprising a maskant material selected from the group consisting of a metal and carbon; and
   processing the substrate article to deposit a coating of a coating material on the second portion of the substrate, without removing the maskant.

2. The method of claim 1, wherein the step of furnishing a substrate article includes the step of
   furnishing a substrate article made of a material selected from the group consisting of a nickel-base alloy, a cobalt-base alloy, and a titanium-base alloy.

3. The method of claim 1, wherein the step of processing includes the step of
   depositing an aluminum coating on the second portion of the substrate.

4. The method of claim 1, wherein the step of masking a first portion includes the step of furnishing a mask layer made of a masking material having
a first sublayer overlying and contacting the foil layer and comprising a mixture of nickel and chromium powders, and
a second sublayer overlying and contacting the first sublayer and comprising a mixture of aluminum oxide and metallic powders.

5. The method of claim 1, wherein the step of masking includes the step of furnishing a mask layer comprising carbon.

6. The method of claim 1, wherein the step of masking includes the step of furnishing a mask layer made of a freestanding graphite piece.

7. The method of claim 1, including an additional step, after the step of processing, of brazing the first portion of the substrate article.

8. The method of claim 1, wherein the substrate article has a hollow interior, and wherein the step of masking a first portion includes the step of providing an aperture through the maskant for access of the coating material to the hollow interior of the substrate article.

9. The method of claim 1, wherein the step of processing includes the step of depositing the coating by vapor phase processing.

10. The method of claim 1, wherein the maskant material is a metal.

11. The method of claim 1, wherein the maskant material is a metal powder.

12. The method of claim 1, wherein a combination of the substrate and the metallic foil layer is selected from the group consisting of a nickel-base substrate and the metallic foil layer made of pure nickel or a nickel-base alloy,
a cobalt-base substrate and the metallic foil layer made of pure cobalt or a cobalt-base alloy, and
a titanium-base substrate and the metallic foil layer made of pure titanium or a titanium-base alloy.

13. A method for processing a substrate article, comprising the steps of:

furnishing a substrate;
masking a first portion of the substrate article with a maskant having exposed edges, the maskant including
a foil layer overlying and contacting the first portion of the substrate, leaving a second portion of the substrate exposed, and
a carbon mask layer overlying the first portion of the substrate and the foil layer, leaving the second portion of the substrate exposed;
applying a sealant around an exposed edge of the maskant to seal a gap between the maskant and the substrate; and
processing the substrate article to deposit a coating of a coating material on the second portion of the substrate, without removing the maskant.

14. The method of claim 13, wherein the step of furnishing a substrate article includes the step of furnishing a substrate article made of a material selected from the group consisting of a nickel-base alloy, a cobalt-base alloy, and a titanium-base alloy.

15. The method of claim 13, wherein the step of processing deposits an aluminum coating on the second portion of the substrate article.

16. The method of claim 13, wherein the carbon mask layer comprises a freestanding graphite piece.

17. The method of claim 13, wherein the substrate article has a hollow interior, and wherein the step of masking a first portion includes the step of providing an aperture through the maskant for access of the coating material to the hollow interior of the substrate article.

18. The method of claim 13, including an additional step, after the step of processing, of brazing the first portion of the substrate article.

19. The method of claim 13, wherein the step of processing includes the step of depositing the coating by vapor phase processing.

20. The method of claim 13, wherein the carbon mask layer is a graphite mask layer.

21. The method of claim 13, wherein a combination of the substrate and the foil layer is selected from the group consisting of a nickel-base substrate and the foil layer made of pure nickel or a nickel-base alloy,
a cobalt-base substrate and the foil layer made of pure cobalt or a cobalt-base alloy, and
a titanium-base substrate and the foil layer made of pure titanium or a titanium-base alloy.

22. A method for processing a substrate article, comprising the steps of:

furnishing a substrate;
masking a first portion of the substrate article with a maskant including
a metallic foil layer overlying and contacting the first portion of the substrate, leaving a second portion of the substrate exposed, wherein a chemical element that is present in the highest concentration in the substrate is also present in the highest concentration in the metallic foil layer, and
a mask layer overlying and contacting the foil layer, the mask layer comprising a maskant material selected from the group consisting of a metal and carbon; and
processing the substrate article to deposit a coating of a coating material on the second portion of the substrate, without removing the maskant.

23. The method of claim 22, wherein a combination of the substrate and the metallic foil layer is selected from the group consisting of a nickel-base substrate and the metallic foil layer made of pure nickel or a nickel-base alloy,
a cobalt-base substrate and the metallic foil layer made of pure cobalt or a cobalt-base alloy, and
a titanium-base substrate and the metallic foil layer made of pure titanium or a titanium-base alloy.

* * * * *